US006992519B2

(12) United States Patent
Vilander et al.

(10) Patent No.: US 6,992,519 B2
(45) Date of Patent: Jan. 31, 2006

(54) METHOD AND APPARATUS PROVIDING CANCELLATION OF SECOND ORDER INTERMODULATION DISTORTION AND ENHANCEMENT OF SECOND ORDER INTERCEPT POINT (IIP2) IN COMMON SOURCE AND COMMON EMITTER TRANSCONDUCTANCE CIRCUITS

(75) Inventors: Ari Vilander, Kerava (FI); Pete Sivonen, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/777,927

(22) Filed: Feb. 11, 2004

(65) Prior Publication Data

US 2005/0174167 A1   Aug. 11, 2005

(51) Int. Cl.
*G06G 7/12* (2006.01)
(52) U.S. Cl. .................. 327/359; 327/355; 455/333
(58) Field of Classification Search ........ 327/355–359, 327/427; 455/333, 326
See application file for complete search history.

(56) References Cited

U.S. PATENT DOCUMENTS

| | | | | |
|---|---|---|---|---|
| 5,420,538 A | * | 5/1995 | Brown | 330/252 |
| 6,531,924 B2 | * | 3/2003 | Aparin | 330/296 |
| 2002/0084840 A1 | * | 7/2002 | Tsuchi | 327/563 |

OTHER PUBLICATIONS

"A Voltage-Controllable Linear MOS Transconductor Using Bias Offset Technique", Wang, Zhenhua, et al., IEEE Journal of Solid-State Circuits, vol. 25, No. 1, Feb. 1990, pp. 315-317.
"A Versatile CMOS Linear Transconductor/Square-Law Function Circuit", Seevinck, Evert, et al., IEEE Journal of Solid-State Circuits, vol. No. 22, Jun. 1987, pp. 366-377.
"Design of Linear CMOS Transconductance Elements", Nedungadi, A., et al., IEEE Transactions On Circuits And Systems, vol. CAS-31, No. 10, Oct. 1984, pp. 891-943.
"Adaptive Biasing CMOS Amplifiers", Degrauwe, Marc G., et al., IEEE Journal Of Solid-State Circuits, vol. SC-17, No. 3, Jun. 1982, pp. 522-528.
"A Linear MOS Transconductor Using Source Degeneration and Adaptive Biasing", Kuo, Ko-Chi, et al., IEEE Transactions On Circuits And Systems-II. Analog And Digital Signal Processing, vol. 48, No. 10, Oct. 2001, pp. 937-943.

* cited by examiner

*Primary Examiner*—Dinh T. Le
(74) *Attorney, Agent, or Firm*—Harrington & Smith, LLP

(57) ABSTRACT

A transconductor circuit includes a first input device $M_1$ and a second input device $M_2$ each having a control terminal coupled to a radio frequency input signal, and a bias setting device $M_B$ having a control terminal coupled to the radio frequency input signal and an output coupled to the control terminal of each of said $M_1$ and $M_2$. $M_B$ is partitioned into two equal sized bias setting devices $M_{B1}$ and $M_{B2}$. In the preferred embodiment $M_{B1}$ and $M_{B2}$ are coupled to the control terminals of $M_1$ and $M_2$ for establishing a bias voltage at the control terminals of $M_1$ and $M_2$. The circuit is shown to substantially cancel second-order intermodulation distortion and to enhance a second order intercept point.

33 Claims, 8 Drawing Sheets

METHOD AND APPARATUS PROVIDING CANCELLATION OF SECOND ORDER INTERMODULATION DISTORTION AND ENHANCEMENT OF SECOND ORDER INTERCEPT POINT (IIP2) IN COMMON SOURCE AND COMMON EMITTER TRANSCONDUCTANCE CIRCUITS

TECHNICAL FIELD

This invention relates generally to radio frequency (RF) circuits and, more specifically, relates to circuitry for improving the second-order intercept point (IIP2) of down conversion mixers, such as those used in direct conversion RF receiver application specific integrated circuits (ASICs).

BACKGROUND

In modern cellular wireless receivers the use of a zero-IF (direct conversion) receiver architecture (see FIG. 1) has become popular as a high level of integration can be obtained. As a consequence, a low material or component cost can be obtained. However, one of the most severe limitations on the use of direct conversion techniques is the need to provide an extremely high IIP2.

In FIG. 1 the zero-IF receiver 1 includes a filter 2 coupled to an antenna 3, a low noise amplifier (LNA) 4 that feeds 90 degree phase quadrature down conversion mixers 5A, 5B fed from a local oscillator (LO) 5C. The outputs of mixers 5A, 5B are in-phase (I) and quadrature phase (Q) baseband signals that are applied through low pass filters 6A, 6B and variable gain amplifiers 7A, 7B to analog to digital (A/D) converters 8A, 8B, respectively.

In a homodyne receiver, the second-order intermodulation introduces undesirable spectral components at baseband, which degrade the receiver sensitivity. For example, if two strong interferers at frequencies $f_1$ and $f_2$ close to the channel of interest experience even-order distortion, they generate a low-frequency interference signal at the difference frequency $f_1-f_2$. This may occur in the low noise amplifier (LNA) or in the mixer.

However, if the LNA and mixer are ac-coupled, the low-frequency beat signal generated in the LNA is filtered out. In addition, the double-balanced down conversion mixer topology suppresses even-order distortion. In an ideal mixer the low-frequency beat present at the mixer RF input is up-converted, but in reality such mixers present a finite feedthrough from the RF input to the IF output, which results in a finite IIP2. In general, it is the down conversion mixer that determines the achievable IIP2 of the receiver.

The majority of the active double-balanced mixers utilized in wireless receivers are based on the Gilbert mixer topology (FIG. 2). In general, both the RF input $g_m$-stage (MB, M1–M2) devices and switching devices (M3–M6) contribute to the mixer nonlinearity, and the mixer IIP2 is set by its second-order nonlinearity and mismatches. In order to improve the mixer IIP2 it is essential to reduce the second-order intermodulation products generated in the mixer, since the device matching cannot be improved beyond a certain limit.

The second-order products generated in the mixer RF input $g_m$-stage can be eliminated by the differential pair RF input stage shown in FIG. 2 (MB, M1–M2). However, as the third-order intercept point (IIP3) of the differential pair is worse than the IIP3 of the common-source (emitter) amplifier at a given value of bias, the common-source (emitter) RF input amplifier is usually preferred to the differential pair.

Moreover, as the supply voltage ($V_{DD}$) scales down with transistor technology, the stacking of four devices in the standard Gilbert cell becomes difficult.

The second-order products generated in the mixer RF input $g_m$-stage can also be eliminated by ac-coupling the RF input stage from the switches, as shown in FIG. 3. Unfortunately, the additional current sources MB1 and MB2 and load resistors RL3 and RL4 increase the mixer NF and add additional parasitic capacitance at the common-node of the switching devices. This parasitic capacitance increases the second-order intermodulation generated in the switching devices.

The conventional attempts to overcome the above mentioned problems includes the use of the fully differential RF input stage (such as the differential pair), the use of ac-coupling the RF input stage from the switches, and the use of dynamic matching techniques.

For example, dynamic matching can be used to increase the IIP2 of the down conversion mixers 5A, 5B. Unfortunately, this technique adds additional complexity to the down conversion process, as two additional multipliers or mixers and LO signals are required. First, one additional mixer is needed at the RF or LO path preceding the main mixing process to mix the desired signal from RF to some (RF+IF) frequency. Then, the main mixer down-converts the desired signal to the IF frequency. Finally, another additional mixer down-converts the desired signal from IF to baseband and up-converts the second-order intermodulation products and 1/f-noise to the IF-frequency. In this technique the undesired mixing products can cause problems, and furthermore the additional mixing stages can raise the thermal noise of the entire down-converter.

The foregoing problems are aggravated when supply voltages are reduced. For example, the supply voltage in a modern sub-micron CMOS technology is very low (on the order of only one volt, i.e., 1.2V) for analog and RF circuits.

SUMMARY OF THE PREFERRED EMBODIMENTS

The foregoing and other problems are overcome, and other advantages are realized, in accordance with the presently preferred embodiments of these teachings.

This invention provides a circuit technique for canceling second-order intermodulation distortion and enhancing the IIP2 in common-source, common-emitter and degenerated transconductance ($g_m$) circuits. The improved circuit can be utilized as the RF input $g_m$-stage in a double-balanced down conversion mixer, such as one used in an RF communications unit such as a cellular telephone, or any type of device that includes a cellular telephone interface (e.g., a gaming device that includes cellular telephone circuitry for establishing communications with another gaming participant). Through the use of the improved circuit the achievable IIP2 of the mixer is limited only by the linearity of the switching devices and component mismatches. The improved circuit has some properties similar to those found in a conventional differential pair in the sense that it suppresses second-order intermodulation distortion. However, the improved circuit is more suitable for operation at low supply voltages as it has only one device stacked between the input and output. In the conventional differential pair two stacked devices are required and consume the voltage headroom. The circuit technique in accordance with this invention also reduces the need for tuning to maximize the IIP2, and correspondingly increases the yield of the receiver RF ASIC. The improved circuit may also be used as a current mirror having a current mirror ratio that is substantially insensitive to voltage swings at the gate (base) of a current mirrored transistor.

The RF input $g_m$-stage made possible by the use of this invention is based on the common-source (emitter) $g_m$-circuit. This circuit provides second-order intermodulation distortion suppression. Moreover, in this circuit no additional noise sources are added in the mixer.

This invention also provides advantages when used with low supply voltage designs (e.g., with supply voltages of about one volt, such as 1.2 volt designs), and also improves the current mirror ratio sensitivity to the RF voltage swings at the input.

A transconductor circuit includes a first input device $M_1$ and a second input device $M_2$ each having a control terminal coupled to a radio frequency input signal, and a bias setting device $M_B$ having a control terminal coupled to the radio frequency input signal and an output coupled to the control terminal of each of said $M_1$ and $M_2$. $M_B$ is partitioned into two equal sized and paralleled (drain connected together) bias setting devices $M_{B1}$ and $M_{B2}$. In this embodiment $M_{B1}$ and $M_{B2}$ are coupled to the control terminals of $M_1$ and $M_2$ for establishing a bias voltage at the control terminals of $M_1$ and $M_2$. The circuit is shown to substantially cancel second-order intermodulation distortion and to enhance a second order intercept point.

In one embodiment $M_1$, $M_2$, $M_{B1}$ and $M_{B2}$ are CMOS field effect transistors (FETS), the control terminal of each is a gate, and $M_1$ and $M_2$ are connected in a common source configuration.

In another embodiment $M_1$, $M_2$, $M_{B1}$ and $M_{B2}$ are bipolar transistors $Q_1$, $Q_2$, $Q_{B1}$ and $Q_{B2}$, the control terminal of each is a base, and $Q_1$ and $Q_2$ are connected in a common emitter configuration. The common emitter configuration may be a degenerated common emitter configuration, such as one that is resistively degenerated. In the preferred embodiments a value of the degeneration impedance of each of $Q_{B1}$ and $Q_{B2}$ is about twice the value of a degeneration impedance that would be used if only a single degenerated bias transistor $Q_B$ were used in place of $Q_{B1}$ and $Q_{B2}$.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

The following description of this invention is organized as follows. First, general expressions for the weak intermodulation distortion components in $g_m$-amplifiers are revised and the equations describing the distortion in CMOS differential pair and common-source amplifiers are presented. Next, the distortion formulas for the CMOS $g_m$-amplifier in accordance with an aspect of this invention are derived and compared with the traditional results. This procedure is then repeated for a bipolar differential pair and common-emitter amplifier, and the results are compared with the bipolar $g_m$-amplifier in accordance wit the invention. The analysis is also extended to the case of degenerated common-emitter amplifiers. Finally, for the sake of illustration, several performance comparisons based on the simulations are made.

A. Weak Intermodulation Distortion Components

Consider first a transconductance element that exhibits a weak nonlinearity. It is assumed that the output current of the $g_m$-amplifier can be expressed in terms of its input voltage by a Taylor power series:

$$i_{out} = a_0 + a_1 v_{in} + a_2 v_{in}^2 + a_3 v_{in}^2 \tag{1}$$

Moreover, the IIP2 and IIP3 of the amplifier, in voltage quantities, can be expressed as $$v_{IIP2} = \left| \frac{a_2}{a_1} \right|, \tag{2}$$

$$v_{IIP3} = \sqrt{\frac{4}{3} \left| \frac{a_1}{a_3} \right|} \tag{3}$$

respectively.

B. Intermodulation Distortion in CMOS Transconductance Amplifiers

B.1 CMOS Differential Pair

Figure 1:
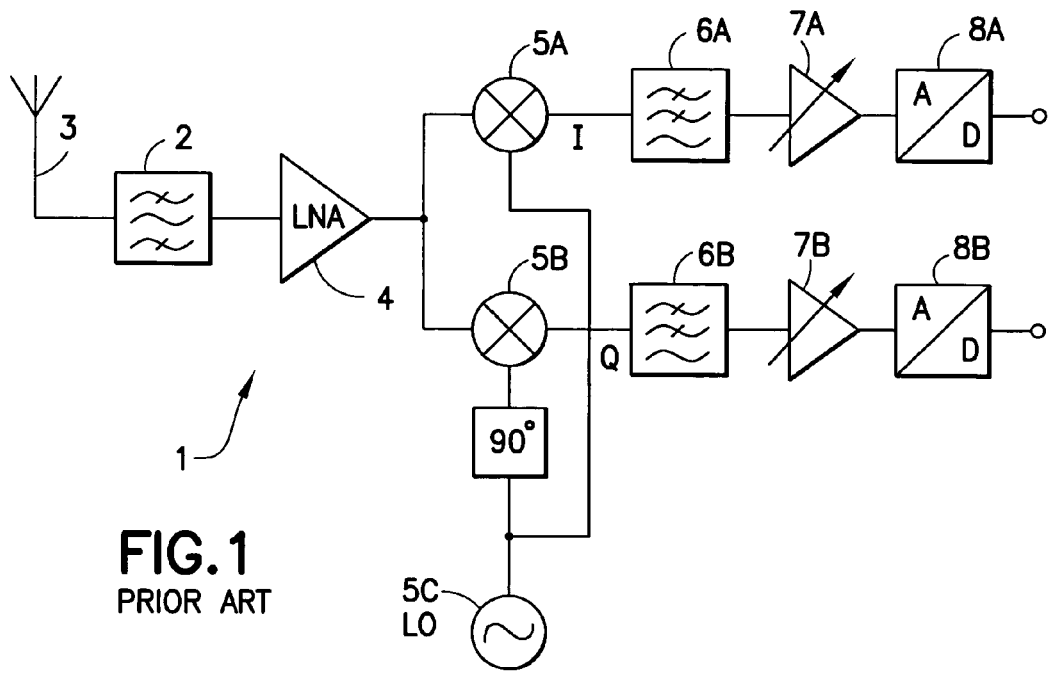
FIG. 1 is a block diagram of a conventional zero-IF receiver architecture.
Figure 2:
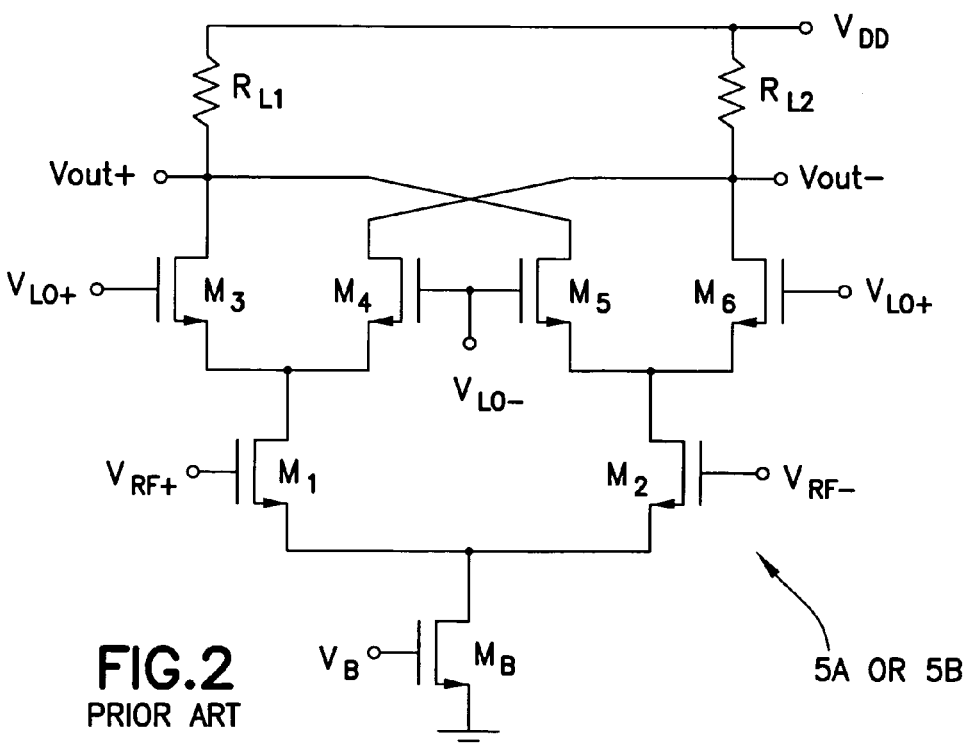
FIG. 2 is a schematic diagram of a conventional double-balanced Gilbert mixer realized with CMOS technology.
Figure 3:
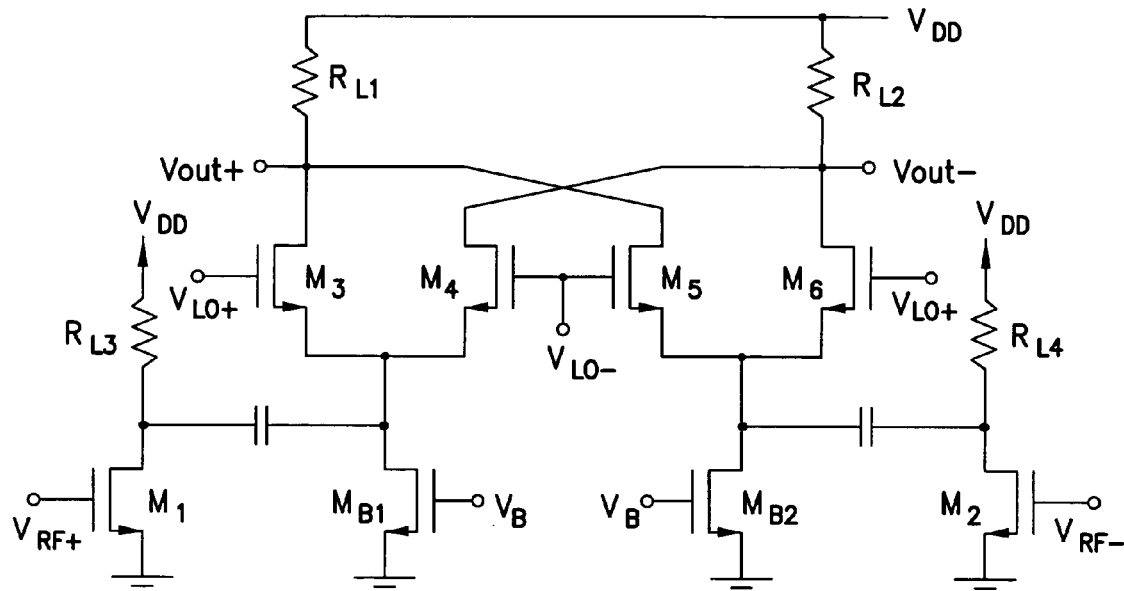
FIG. 3 is a schematic diagram of a conventional double-balanced mixer having an ac-coupled RF input stage.
Figure 4:
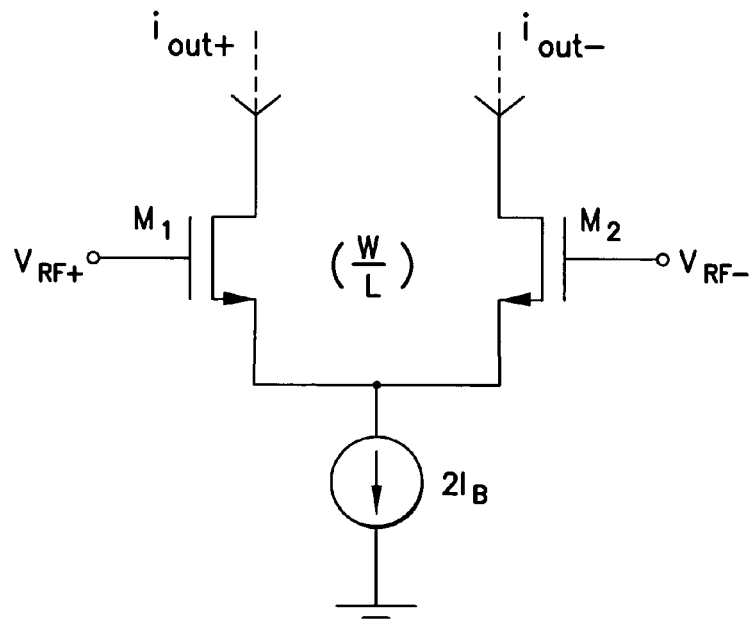
FIG. 4 is a schematic diagram of a conventional CMOS differential pair as an RF input $g_m$-stage.

The traditional CMOS Gilbert mixer utilizes a differential pair, as shown in FIG. 4, as its RF input stage to reject common-mode interference and to suppress second-order intermodulation distortion. The properties of the differential pair can be examined by modeling the MOS transistor with its square-law relationship $$i_{DS} = \frac{\mu C_{ox}}{2} \frac{W}{L}(v_{GS} - V_T)^2 = \frac{K}{2} \frac{W}{L}(v_{GS} - V_T)^2. \quad (4)$$

Assume that the input signals have both the differential and common-mode components $$v_{RF+} = \frac{v_{in}}{2} + v_{CM}, \quad v_{RF-} = -\frac{v_{in}}{2} + v_{CM}. \quad (5)$$

The bias current $2I_B$ can be expressed as $$2I_B = \frac{K}{2}\frac{W}{L}\left[\left(V_{GSO} + v_{CM} - V_T + \frac{v_{in}}{2}\right)^2 + \left(V_{GSO} + v_{CM} - V_T - \frac{v_{in}}{2}\right)^2\right] \quad (6)$$

from which the gate-source bias voltage can be solved as $$V_{GSO} = \sqrt{\frac{2I_B}{K\frac{W}{L}} - \frac{v_{in}^2}{4}} - v_{CM} + V_T. \quad (7)$$

Furthermore, the single-ended output current of the RF input stage can be written as $$i_{out+} = \frac{K}{2}\frac{W}{L}\left(V_{GSO} - V_T + v_{CM} + \frac{v_{in}}{2}\right)^2 \quad (8)$$

$$= I_B + \frac{g_m}{2}v_{in} - \frac{g_m}{32}\frac{K}{I_B}\frac{W}{L}v_{in}^2 + \dots$$

where Eq. (7) is used and the resultant formula expanded to the power series. Here $$g_m = \sqrt{2K\frac{W}{L}I_B} \quad (9)$$

is the input device transconductance. From Eq. (8) it is seen that the single-ended output current does not have any second-order or common-mode components, which is a clear advantage of the basic differential pair. Moreover, by using Eq. (3), the IIP3 of the MOS differential pair can be expressed as $$v_{IIP3} = 8\sqrt{\frac{I_B L}{3KW}} \quad (10)$$

$$= 4\sqrt{\frac{2}{3}}(V_{GS} - V_T),$$

which is a well-known result.

B.2 Conventional Common-Source Transconductor Circuit

Figure 5A:
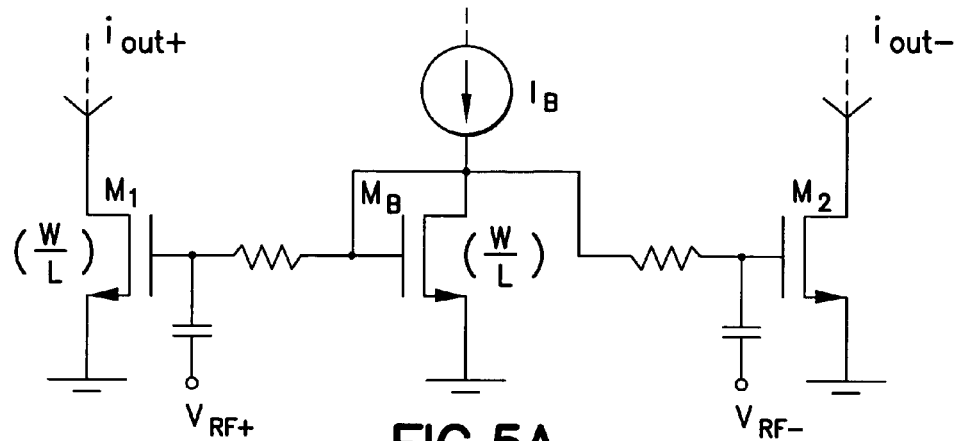
FIG. 5A is a schematic diagram of a conventional common-source RF input $g_m$-stage.

Due its superior third-order intermodulation properties the majority of low-voltage CMOS down-conversion mixers utilize a common-source RF input stage of a type shown in FIG. 5A. However, a drawback of the conventional common-source circuit is its second-order intermodulation characteristics, and its inability to reject common-mode interference.

Assume for simplicity that the current mirror ratio is one, which does not have any effect on the derived results. From FIG. 5A, the bias voltage at the gate of M1 (and M2) can be expressed as $$V_{GSO} = \sqrt{\frac{2I_B}{K\frac{W}{L}}} + V_t. \quad (11)$$

If one assumes that the input signal has only the differential component, $v_{RF+}=v_{in}/2$ (the single-ended response for the common-mode signal is similar). By using Eq. (11), the single-ended output current of the RF input stage can be written as $$i_{out+} = \frac{K}{2}\frac{W}{L}\left(V_{GSO} + \frac{v_{in}}{2} - V_T\right)^2 \quad (12)$$

$$= I_B + \frac{g_m}{2}v_{in} + \frac{K}{2}\frac{W}{L}\frac{v_{in}^2}{4}.$$

Equation (12) reveals the drawbacks of the conventional common-source $g_m$-circuit. First, if the RF input signal consists of two closely spaced signals at RF band $$v_{in}=v_{RF}(\cos(\omega_1 t)+\cos(\omega_2 t)), \quad (13)$$

where $v_{RF}$ is the differential RF amplitude, the dc-component of the output current is not exactly $I_B$, but the dc-component also depends on the input signal amplitude $$DC: \left(I_B + \frac{K}{2}\frac{W}{L}\frac{v_{RF}^2}{4}\right). \quad (14)$$

This results in additional distortion in the mixer switches. In addition, the output current includes a second-order intermodulation distortion component due to the squared term in Eq. (12). Thus, the corresponding input stage single-ended IIP2 can be expressed by using Equations (2) and (12)

$$v_{IIP2} = 4\sqrt{\frac{2I_B L}{KW}} = 4(V_{GS} - V_T), \quad (15)$$

which is a well-known result. It should be noticed however that the IIP2 given by Eq. (15) represents the differential input voltage. Each MOS device in FIG. 5A experiences one half of this voltage.

From Eq. (12) it is seen that the single-ended output current does not produce any third-order intermodulation components, since the cubic term is missing. Thus, the IIP3 of common-source circuit is infinite. In practice, however, the IIP3 is finite due to the fact that the square law given by Eq. (4) is only approximate. Nevertheless, in general the common-source amplifier normally exhibits a very good IIP3.

Figure 5B:
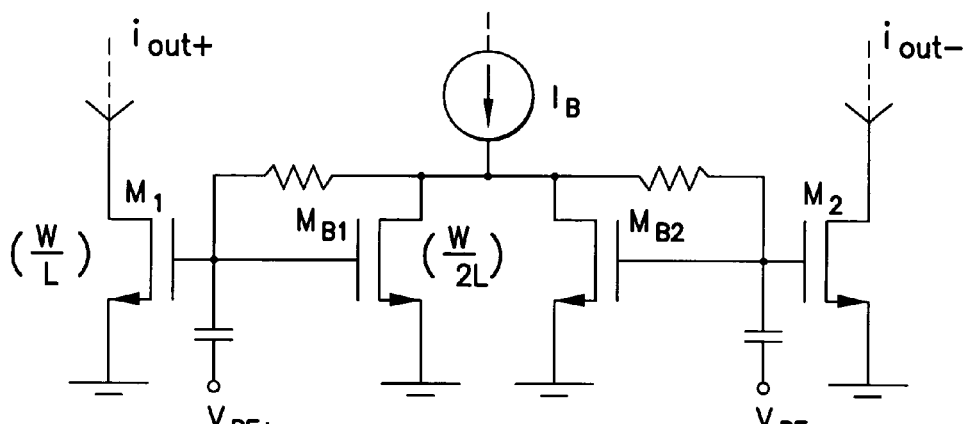
FIG. 5B is a schematic diagram of an improved common-source RF input $g_m$-stage in accordance with this invention.

B.3 Improved Common-Source Transconductor Circuit in Accordance with this Invention FIG. 5B illustrates a circuit for canceling the second-order intermodulation distortion, in accordance with this invention, in a common-source circuit. In this circuit, the bias transistor $M_B$ shown in FIG. 5A is divided on two equal sized bias devices ($M_{B1}$ and $M_{B2}$) sized as half (W/2L) of the original transistor $M_B$. Moreover, the differential RF input signal is connected to the gates of the bias transistors $M_{B1}$ and $M_{B2}$.

If the circuit shown in FIG. 5B is analysed by using a Volterra series approach, it can be shown that the single-ended output current of the RF input transconductor does not exhibit any $IM_2$ components, which is a clear improvement over the conventional common-source circuit in the sense of entire mixer IIP2.

The IIP3 of the proposed transconductor can be approximated by $$v_{IIP3} = 4\sqrt{\frac{2I_B L}{KW}} = 4(V_{GS} - V_T) \quad (16)$$

which is seen to be by a factor of $\sqrt{3/2}$ (1.8dB) larger than the IIP3 of the differential pair transconductor. On the other hand, compared to the conventional common-source transconductor, the circuit exhibits a higher third-order nonlinearity.

It can be shown that the output current of the improved transconductor has a dc-component, which is exactly $I_B$. This again a clear benefit as compared to the conventional common-source transconductor, in which the dc-component depends on the RF input amplitude.

It can be noted that the circuit, as compared to the differential pair transconductor, differs in its ability to reject common-mode signals. This can be readily seen, for instance, by performing a straightforward small-signal analysis. On the other hand, the improved transconductor has a clear advantage over the differential pair. Namely, the improved transconductor circuit is more suitable for operation at a low supply voltage (e.g., a supply voltage of about a volt). This is because the circuit shown in FIG. 5B has only one device stacked between the input and output, whereas the conventional differential pair shown in FIG. 4 has two stacked devices, thereby consuming the voltage headroom.

C. Intermodulation Distortion in Bipolar Transconductance Amplifiers

C.1 Bipolar Differential Pair

Figure 6:
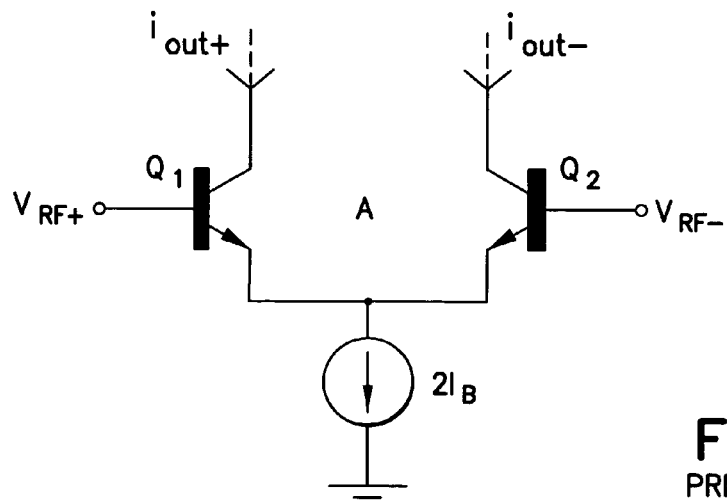
FIG. 6 is a schematic diagram of a conventional bipolar differential pair as an RF input $g_m$-stage.

As is shown in FIG. 6, the traditional bipolar Gilbert mixer utilizes a differential pair ($Q_1$, $Q_2$) as its RF input stage to reject common-mode interference and to suppress second-order intermodulation distortion. The properties of the bipolar differential pair can be examined in a similar fashion as the CMOS pair, but in this case the bipolar transistor is modeled with its exponential characteristics $$i_C = I_S e^{\frac{v_{BE}}{V_t}}. \quad (17)$$

Assume that the input signals have both the differential and common-mode components as given by Eq. (5). The bias current $2I_B$ can be expressed as $$2I_B = I_S e^{\frac{(V_{BE0}+v_{CM}+v_{in}/2)}{V_t}} + I_S e^{\frac{(V_{BE0}+v_{CM}-v_{in}/2)}{V_t}}, \quad (18)$$

from which $$I_S e^{\frac{(V_{BE0}+v_{CM})}{V_t}} = \frac{2I_B}{e^{\frac{v_{in}}{2V_t}} + e^{\frac{-v_{in}}{2V_t}}}. \quad (19)$$

The single-ended output current of the RF input stage can be written as $$\begin{aligned} i_{out+} &= I_S e^{\frac{(V_{BE0}+v_{CM}+v_{in}/2)}{V_t}} \\ &= 2I_B \frac{e^{\frac{v_{in}}{2V_t}}}{e^{\frac{v_{in}}{2V_t}} + e^{-\frac{v_{in}}{2V_t}}} \\ &= I_B + \frac{g_m}{2} v_{in} - \frac{g_m}{24 V_t^2} v_{in}^3 + \dots \end{aligned} \quad (20)$$

where Eq. (19) has been used and the resultant formula has been expanded to the power series. Here $$g_m = \frac{V_t}{I_B} \quad (21)$$

is the input device transconductance. From Eq. (20) it can be seen that the single-ended output current does not have any second-order or common-mode components, which is a clear advantage of the basic differential pair. Moreover, by using Eq. (3), the IIP3 of the bipolar differential pair can be expressed as $$v_{IIP3} = 4V_t. \quad (22)$$

which is a well-known result.

C.2 Conventional Common-Emitter Transconductor Circuit

The common-emitter amplifier is rarely used as a mixer RF input stage without degeneration. In the typical case either resistive or inductive degeneration is used to improve the input stage linearity, without increasing the current consumption. However, in the analysis of the intermodulation distortion in a degenerated amplifier, the results derived from the analysis without degeneration are useful. Therefore, in this context, the nonlinearity analysis for the non-degenerated amplifier is carried out before the analysis of the degenerated counterpart.

Figure 7A:
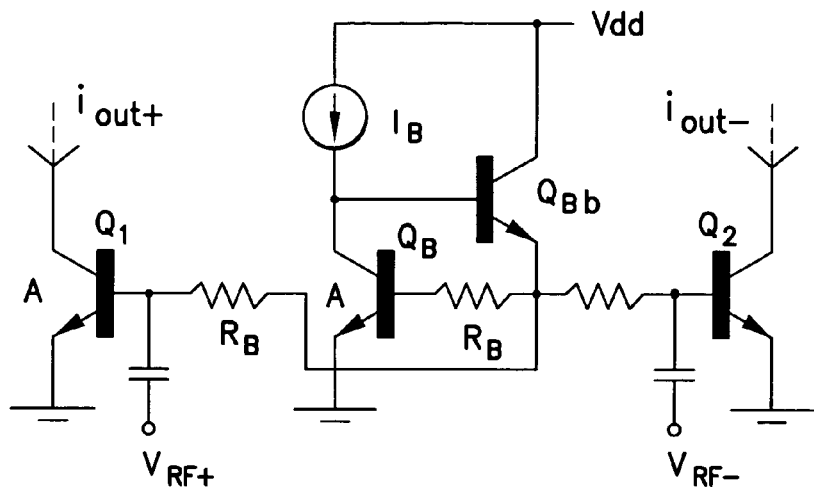
FIG. 7A is a schematic diagram of a conventional common-emitter RF input $g_m$-stage.

An analysis that is similar to that carried for the conventional common-source RF input $g_m$-circuit can also be applied to the conventional common-emitter circuit shown in FIG. 7A. Assume again for simplicity that the current mirror ratio is one. All of the devices shown in FIG. 7a are assumed to have equal saturation currents $I_S$, since their base-emitter areas are equal. By neglecting the base currents, the bias voltage at the base of $Q_1$ can be expressed as $$V_{BEO} = V_t \ln\left(\frac{I_B}{I_S}\right). \quad (23)$$

Assume that the input signal has only the differential component $v_{RF+}=v_{in}/2$ (the single-ended response for the common-mode signal is exactly similar). The single-ended output current of the RF input stage can be written as $$i_{out+} = I_S e^{\frac{(V_{BEO}+v_{in}/2)}{V_t}} \quad (24)$$
$$= I_B + \frac{g_m}{2}v_{in} + \frac{g_m}{8V_t}v_{in}^2 + \frac{g_m}{48V_t^2}v_{in}^3 + \ldots$$

where Eq. (23) has been used and the resultant formula has been expanded to the power series. Equation (24) reveals the drawbacks of the conventional common-emitter $g_m$-circuit. First, if the RF input signal consists of two closely spaced signals at the RF band given by Eq. (13), the dc-component of the output current is not exactly $I_B$, but also depends on the input signal amplitude $$DC: \left(I_B + \frac{g_m}{8V_t}v_{RF}^2\right). \quad (25)$$

In addition, the output current includes a second-order intermodulation distortion component due to the squared term in Eq. (26). Thus, the corresponding input stage single-ended IIP2 can be expressed by using Equations (2) and (26)

$$v_{IIP2}=4V_t, \quad (26)$$

which is a well-known result.

The output current also includes a third-order intermodulation distortion component due to the cubic term in Eq. (24). Thus, the corresponding input stage single-ended IIP3 can be expressed by using Equations (3) and (24)

$$v_{IIP3}=4\sqrt{2}V_t^* \quad (27)$$

Figure 7B:
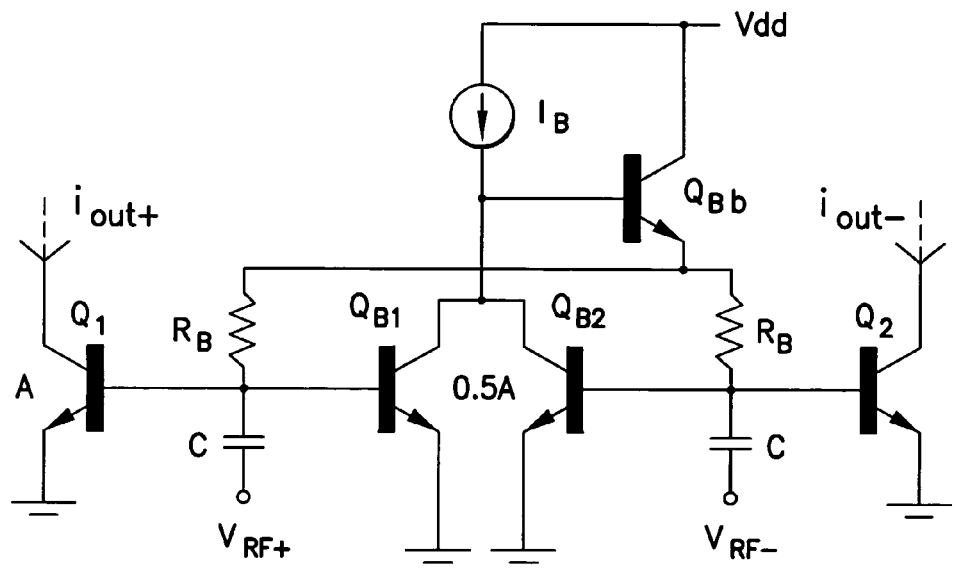
FIG. 7B is a schematic diagram of an improved common-emitter RF input $g_m$-stage in accordance with this invention.

C.3 Improved Common-Emitter Transconductor Circuit in Accordance with this Invention FIG. 7B illustrates a bipolar realization of the circuit presented for the MOS devices in FIG. 5B. Again, the original bias transistor shown in FIG. 7A is divided into two equally sized bias devices ($Q_{B1}$ and $Q_{B2}$) sized as half (A/2) of the original transistor ($Q_B$). The differential RF input signal is also brought to the bases of the bias transistors $Q_{B1}$ and $Q_{B2}$.

Again, if the circuit shown in FIG. 7B is analysed by using the Volterra series approach, it can be shown that the single-ended output current of the RF input transconductor does not exhibit any $IM_2$ components, which is a clear improvement over the conventional common-emitter circuit in the sense of the entire mixer IIP2.

It can be shown that the IIP3 of the improved transconductor equals the IIP3 of the conventional common-emitter transconductor given by Eq. (27). In addition, the output current of the improved transconductor has a dc-component, which is exactly $I_B$. This again a clear benefit of the transconductor of FIG. 7B as compared to the conventional common-emitter transconductor of FIG. 7A, in which the dc-component depends on the RF input amplitude.

A distinction between the transconductor of FIG. 7B as compared to the conventional differential pair is its inability to reject common-mode signals, which can be shown using a straightforward small-signal analysis. On the other hand, the improved transconductor has a clear advantage over the differential pair in its ability to operate at a low supply voltage.

Figure 8A:
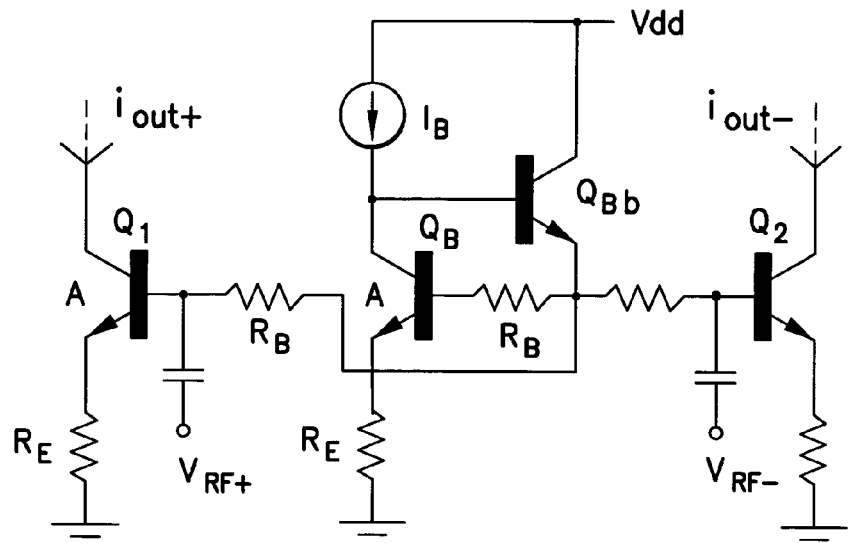
FIG. 8A is a schematic diagram of a conventional common-emitter RF input $g_m$-stage with resistive degeneration.

C.4 Conventional Resistively Degenerated Common-Emitter Transconductor Circuit FIG. 8A shows a conventional resistively degenerated common-emitter amplifier mixer input stage. The intermodulation characteristics of this amplifier can be analyzed by using the results derived for the amplifier without degeneration and from negative feedback theory. Insertion of an emitter resistance RE provides local negative feedback. According to feedback theory, IIP2 and IIP3 of the degenerated amplifier can be expressed as $$v_{IIP2} = \left|\frac{a_1(1+T)^2}{a_2}\right|, \quad (28)$$

$$v_{IIP3} = (1+T)^2\sqrt{\frac{4}{3}\left|\frac{a_1}{a_3(1+T)-2fa_2^2}\right|}, \quad (29)$$

where $a_i$ are the Taylor series coefficients of the transconductance element without degeneration (see Eq. (1)), f represents the transfer function of the feedback network (here simply $R_E$) and $T=fa_1$. By replacing f by $T/a_1$, and by noticing from Eq. (24) that $$a_1 = \frac{g_{mI}}{2} \quad a_2 = \frac{g_{mI}}{8V_t} \quad a_3 = \frac{g_{mI}}{48V_t^2}. \quad (30)$$

Equations (28) and (29) can be rewritten as $$v_{IIP2} = (1+T)^2 4V_t = (1+T)^2 \times v_{IIP2,nofb} \quad (31)$$

$$v_{IIP3} = \frac{(1+T)^2}{\sqrt{1-2T}}4\sqrt{2}V_t = \frac{(1+T)^2}{\sqrt{1-2T}} \times v_{IIP3,nofb}. \quad (32)$$

Here $v_{IIP2,nofb}$ and $v_{IIP3,nofb}$ are the IIP2 and IIP3 without feedback, respectively, as given by Equations (26) and (27). As expected, feedback improves the RF input stage linearity, but at the expense of the reduced input stage $g_m$. Moreover, feedback does not totally remove the second-order intermodulation distortion.

Figure 8B:
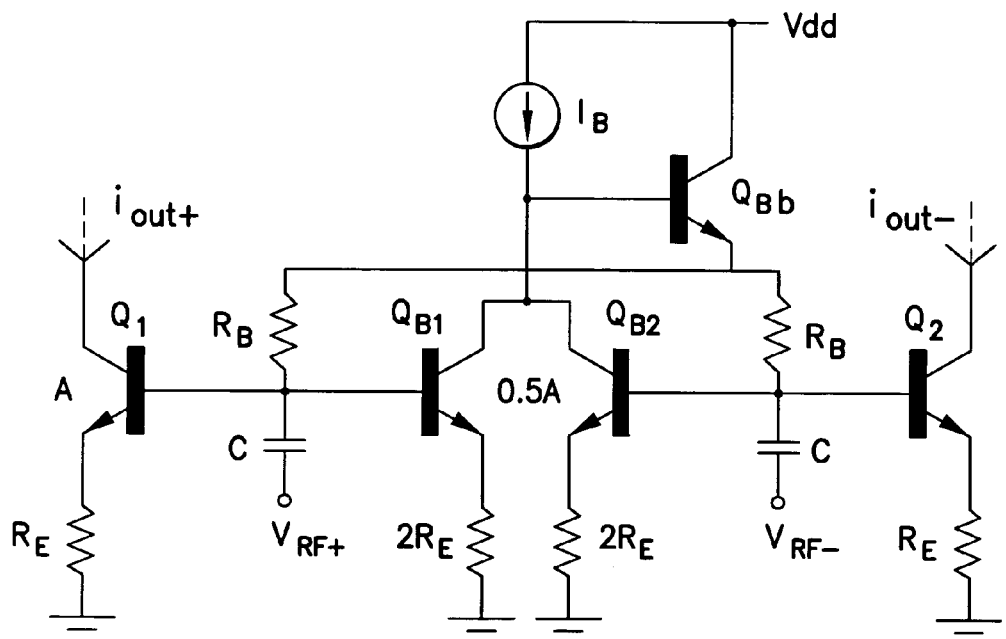
FIG. 8B is a schematic diagram of an improved common-emitter RF input $g_m$-stage with resistive degeneration in accordance with this invention.

C.5 Improved Resistively Degenerated Common-Emitter Transconductor Circuit in Accordance with this Invention FIG. 8B shows an improved resistively degenerated common-emitter amplifier mixer input stage in accordance with this invention. Again, if this circuit is analysed by using the Volterra series approach, it can be shown that the single-ended output current of the RF input transconductor does not have any $IM_2$ components, which is a clear improvement over the conventional common-emitter circuit in the sense of the entire mixer IIP2.

The IIP3 of this embodiment of the improved transconductor can be approximated by $$v_{IIP3} = \frac{(1+T)^2}{\sqrt{1+2T}} 4\sqrt{2} V_t = \frac{(1+T)^2}{\sqrt{1+2T}} \times v_{IIP3,nofb} \quad (33)$$

which is seen to be at maximum (when T=0) by a factor of √2(3 dB) larger than the IIP3 of differential pair transconductor. If T=0, the IIP3 of the improved transconductor equals the IIP3 of the common-emitter transconductor.

It can be shown that the output current of this embodiment of the improved transconductor has a dc-component, which is exactly $I_B$. This again is a clear benefit of the improved transconductor as compared to the conventional common-emitter transconductor, in which the dc-component depends on the RF input amplitude.

Again, the improved transconductor circuit, as compared to the differential pair, lacks an ability to reject common-mode signals, as can be shown by performing a small-signal analysis. On the other hand, and as before, the improved transconductor has at least one clear advantage over the differential pair in that it is more suitable for operating at a low supply voltage.

It is pointed out in FIG. 8B that the degeneration need not be resistive, but could be accomplished using an inductor or a capacitor. Also, the MOS version of the transconductor, and not just the bipolar version, can be degenerated. What is important to take note of is that the value of the degeneration impedance is doubled as compared to the conventional degeneration impedance. For example, note in FIG. 8B that the degeneration impedance of both $Q_{B1}$ and $Q_{B2}$ is 2(RE), as opposed to $R_E$ for $Q_B$ in FIG. 8A.

D. Experimental Results

D.1 CMOS Transconductance RF-Input Stages

What follows is a discussion and comparison of the characteristics of the CMOS differential pair, conventional common-source, and improved common-source RF input $g_m$-stages based on simulation. It is assumed that the circuits are implemented in 0.13 micron CMOS technology, in which the supply voltage is 1.2V. The RF input and bias device sizes in all of the circuits (see FIGS. 4 and 5) are assumed to be (W/L)=(50/0.35). Thus, the current mirror ratio in FIG. 5 is one. Moreover, all the results are presented as input power in dBm. More precisely, the differential RF input voltage is referred to the reference impedance of 100 Ohms.

Figure 9:
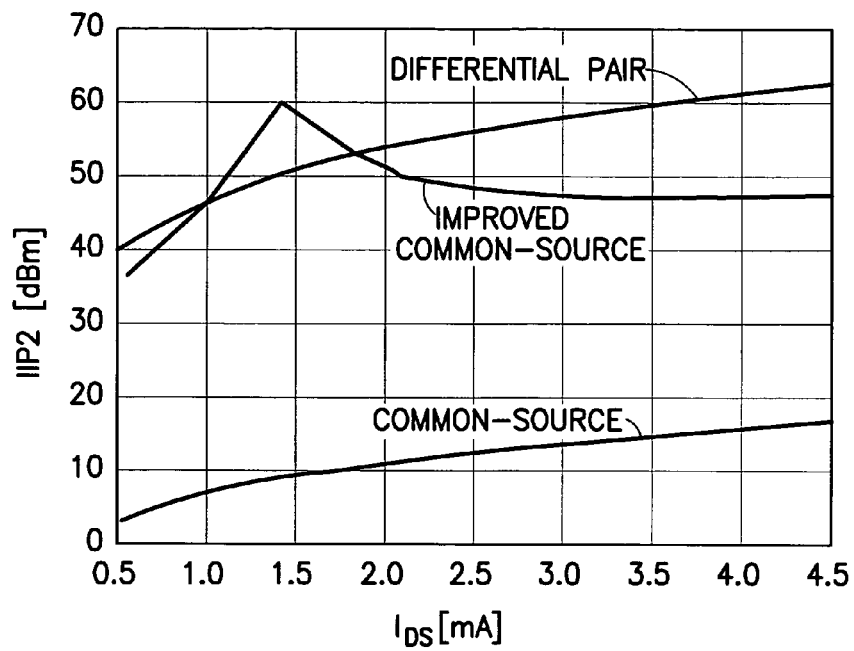
FIG. 9 is a graph depicting a single-ended IIP2 of differential pair, conventional, and improved common-source RF input $g_m$-stages.

The single-ended IIP2s of the differential pair, conventional and improved common-source RF input $g_m$-stages are plotted in FIG. 9 as a function of bias current $I_B$, which is also the drain-source current $I_{DS}$ of the input device. It should be noticed that the IIP2 of the differential pair depends heavily on the output impedance of the bias current source (see FIG. 4). Here, it is assumed that the current source output impedance is 5K Ohms.

From FIG. 9 it is seen that the IIP2 of the improved common-source circuit has similar second-order intermodulation characteristics as the differential pair. On the other hand, the single-ended IIP2 of the conventional common-source amplifier is relatively poor compared to the other circuits.

Figure 10:
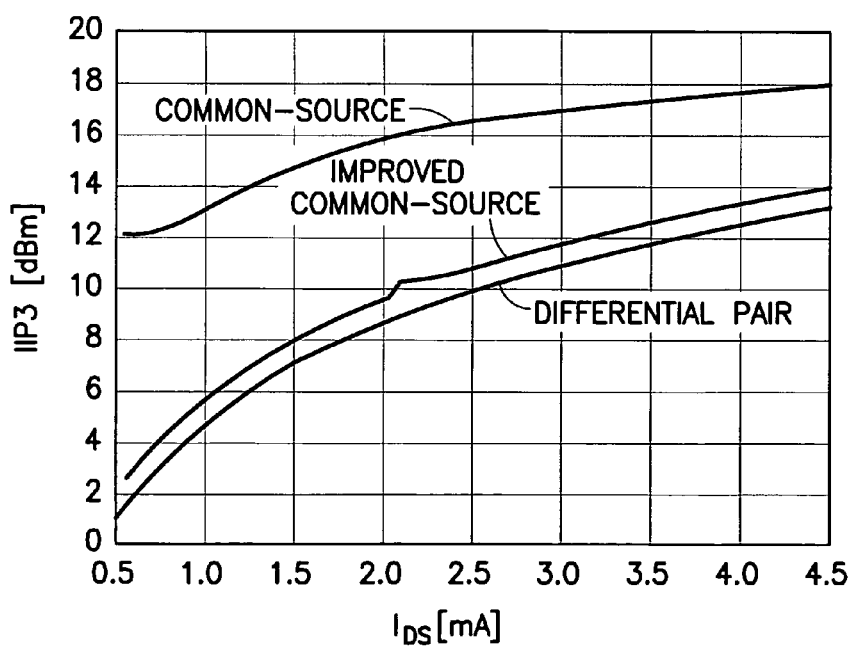
FIG. 10 is a graph depicting the IIP3 of differential pair, conventional, and improved common-source RF input $g_m$-stages.

The IIP3 of differential pair, conventional and improved common-source RF input $g_m$-stages are plotted in FIG. 10 as a function of the bias current $I_B$. It can be seen that the traditional common-source circuit has superior third-order intermodulation properties as compared to the other circuits. However, since the typical requirements for the down-conversion mixer IIP3 are on the order of 5–15 dBm, depending on the radio system and block partitioning, the IIP3's of the improved common-source and differential pair circuits shown in FIG. 10 are sufficient for most applications. However, the conventional common-source circuit requires less current than the other circuits to obtain a given IIP3. Finally, it is also seen that the improved common-source circuit has a slightly better (about 1 dB) IIP3 than the conventional differential pair circuit.

Figure 11:
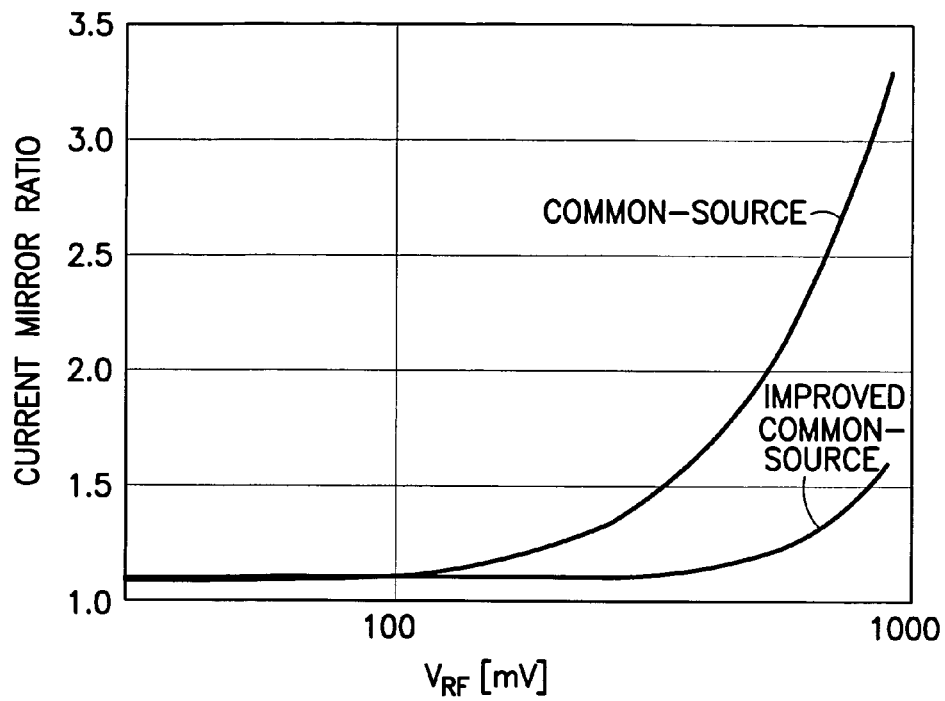
FIG. 11 is a graph depicting a current mirror ratio of conventional and improved common-source RF input $g_m$-stages.

FIG. 11 shows the ratio of the RF input device drain-source dc-current $I_{DS}$ to the bias current $I_B$ as a function of the differential RF input voltage. Without a signal present, the ratio is about 1.1. Moreover, it can be seen that the output current dc-component of the conventional common-source circuit is altered by RF input voltages smaller than 100 mV. In addition, for input voltages larger than 100 mV, the dc-current increases rapidly. On the other hand, the dc-component of the improved common-source circuit remains substantially constant up to an RF input voltages of about 300 mV. For input voltages larger than 300 mV, the dc-component also increases more slowly when compared to the conventional common source circuit case.

D.2 Bipolar Transconductance Rf-Input Stages

What follows now is a discussion and comparison of the characteristics of the degenerated bipolar differential pair, conventional common-emitter, and improved common-emitter RF input $g_m$-stages based on simulation. It is assumed that the circuits are implemented in 0.35 micron BiCMOS technology, in which the supply voltage is 2.7V. The RF input and bias devices in all the circuits (see FIGS. 6 and 8) are implemented with bipolar devices having six emitters and two collectors. Moreover, each transistor is implemented as two bipolar transistors in parallel with an emitter length of 10 microns. Thus, the current mirror ratio in FIG. 8 is one. All of the circuits have resistive degeneration of 30 Ohms.

Figure 12:
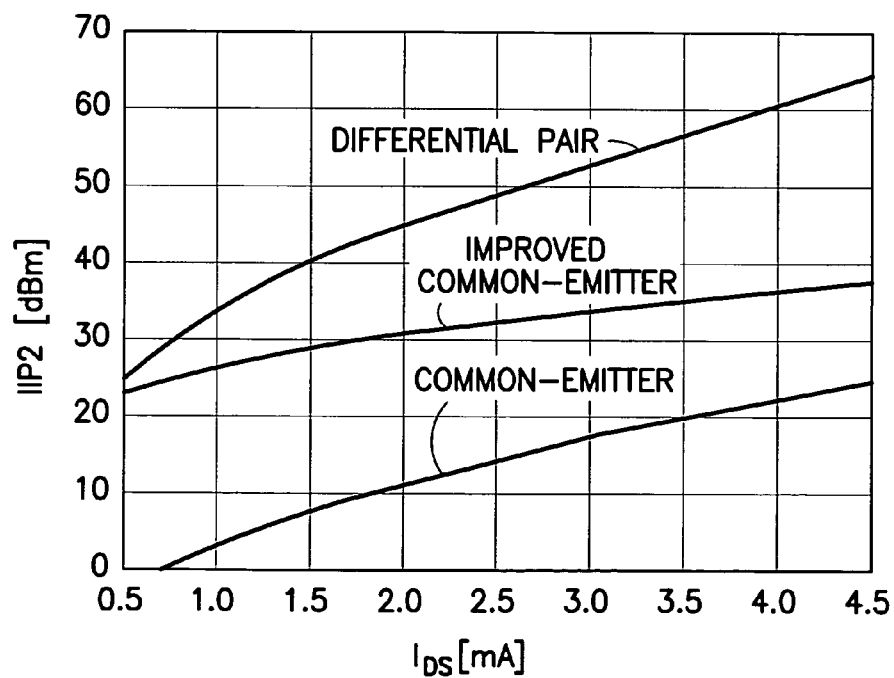
FIG. 12 is a graph depicting a single-ended IIP2 of degenerated differential pair, conventional, and improved common-emitter RF input $g_m$-stages.

The single-ended IIP2 of the differential pair, conventional and improved common-emitter RF input $g_m$-stages are plotted in FIG. 12 as a function of bias current $I_B$, which is also the collector current $I_C$ of the input device. It should be again noticed that the IIP2 of the differential pair depends heavily on the output impedance of the bias current source (see FIG. 6). Here, it is assumed that the current source output impedance is 1K Ohm.

From FIG. 12 it can be seen that the IIP2 of the differential pair is best at a given power consumption. In addition, the improved common-emitter circuit exhibits a 15–20 dB better second-order intermodulation characteristic than the conventional common-emitter amplifier.

Figure 13:
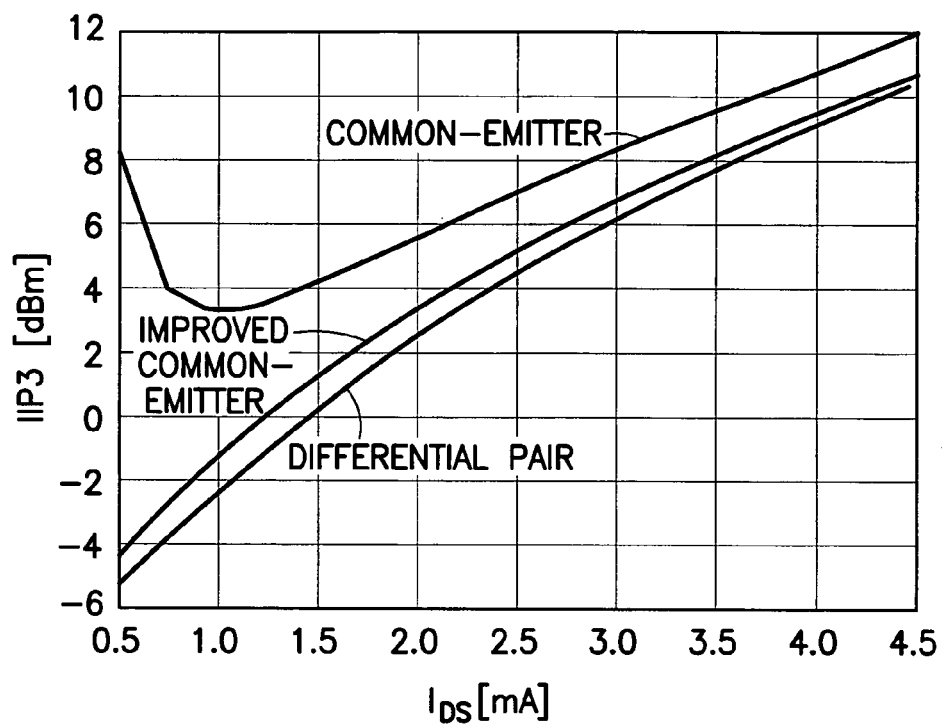
FIG. 13 is a graph depicting the IIP3 of degenerated differential pair, conventional, and improved common-emitter RF input $g_m$-stages.

The IIP3 of the degenerated differential pair, conventional and improved common-emitter RF input $g_m$-stages are plotted in FIG. 13 as a function of bias current $I_B$. It can be seen that the traditional common-emitter circuit exhibits the best third-order intermodulation properties. However, for typical collector currents (>1.5 mA) the difference between the IIP3s of different RF input stages is much smaller when compared to the MOS case.

Figure 14:
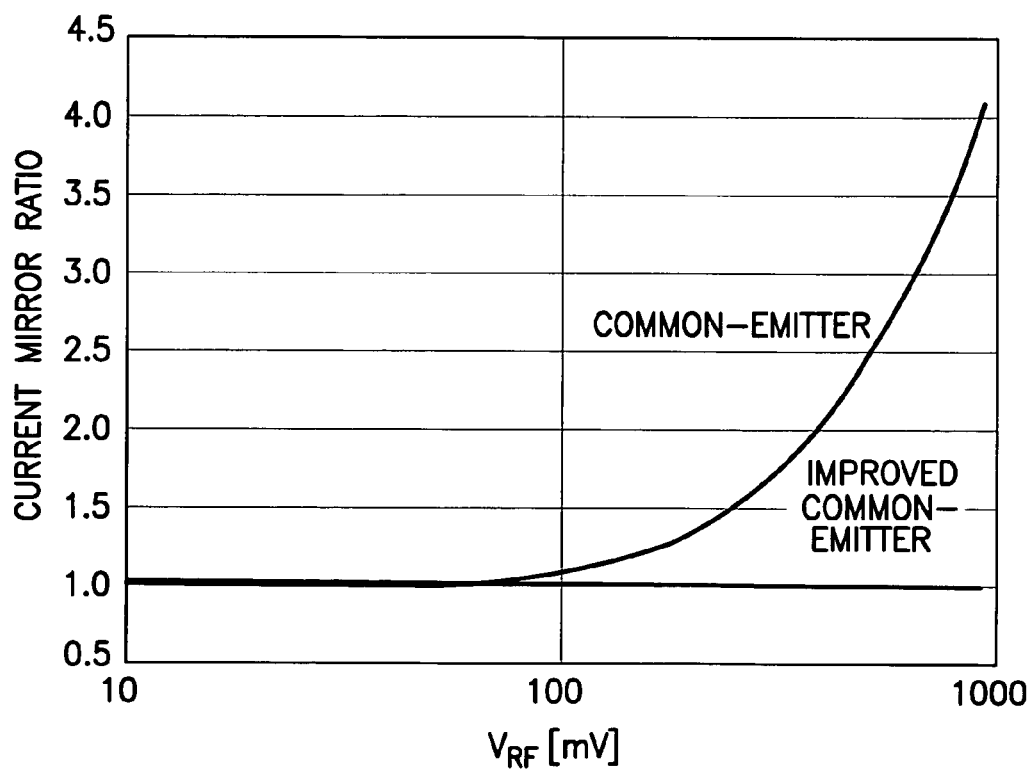
FIG. 14 is a graph depicting a current mirror ratio of conventional and improved degenerated common-emitter RF input $g_m$-stages.

FIG. 14 shows the ratio of the RF input device collector dc-current $I_C$ to the bias current $I_B$ as a function of the differential RF input voltage. Without any signal present, the ratio is about 1.0. Moreover, it can be seen that the output current dc-component of the common-emitter circuit is altered by RF input voltages smaller than 100 mV. In addition, for input voltages larger than 100 mV the dc-current increases rapidly. On the contrary, the dc-component of the improved common-source remains substantially constant up to RF input voltages of about 900 mV.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent circuit embodiments may be may be attempted by those skilled in the art. However, all such and similar modifications of the teachings of this invention will still fall within the scope of this invention.

Furthermore, some of the features of the present invention could be used to advantage without the corresponding use of other features. As such, the foregoing description should be considered as merely illustrative of the principles of the present invention, and not in limitation thereof.

What is claimed is:

1. A transconductor circuit, comprising:
a first input device $M_1$ and a second input device $M_2$ each having a control terminal coupled to a differential radio frequency input signal; and
a bias setting device $M_B$ having a control terminal coupled to said differential radio frequency input signal and an output coupled to said control terminal of each of said $M_1$ and $M_2$, where $M_B$ is partitioned into two equal sized paralleled bias setting devices $M_{B1}$ and $M_{B2}$, where $M_{B1}$ and $M_{B2}$ are coupled to said control terminals of $M_1$ and $M_2$ for establishing a bias voltage at the control terminals of $M_1$ and $M_2$ and wherein said differential radio frequency input signal is coupled to a base of $M_{B1}$ and a base of $M_{B2}$, respectively.

2. A transconductor circuit as in claim 1, where $M_1$, $M_2$, $M_{B1}$ and $M_{B2}$ are CMOS field effect transistors (FETS) and where said control terminal of each is a gate, where $M_1$ and $M_2$ are connected in a common source configuration, where a drain of $M_{B1}$ is coupled to said gate of $M_1$ through a first resistance and to said gate of $M_2$ through a second resistance, and where a drain of $M_{B2}$ is coupled to said gate of $M_1$ through said first resistance and to said gate of $M_2$ through said second resistance.

3. A transconductor circuit as in claim 2, where said gate of $M_{B1}$ and said gate of $M_{B2}$ are each capacitively coupled to said RF input signal.

4. A transconductor circuit as in claim 2, where said drain of each of $M_{B1}$ and $M_{B2}$ is coupled to a source of bias current $I_B$.

5. A transconductor circuit as in claim 1, where $M_1$, $M_2$, $M_{B1}$ and $M_{B2}$ are bipolar transistors $Q_1$, $Q_2$, $Q_{B1}$ and $Q_{B2}$ and where said control terminal of each is a base, where $Q_1$ and $Q_1$ are connected in a common emitter configuration, where a collector of each of $Q_{B1}$ and $Q_{B2}$ is coupled to a source of bias current $I_B$ and to a base of a further bias transistor $Q_{Bb}$ having an emitter coupled to said base of Q1 through a first resistance and to said base of $Q_2$ through a second resistance.

6. A transconductor circuit as in claim 5, where said base of $Q_{B1}$ is coupled to said first resistance and to said base of $Q_1$, and where said base of $Q_{B2}$ is coupled to said second resistance and to said base of $Q_2$.

7. A transconductor circuit as in claim 6, where said bases of $Q_1$, $Q_2$, $Q_{B1}$ and $Q_{B2}$ are each capacitively coupled to said RE input signal.

8. A transconductor circuit as in claim 5, where a collector of $Q_{Bb}$ is coupled to a supply voltage $V_{DD}$.

9. A transconductor circuit as in claim 5, where emitters of $Q_1$, $Q_2$, $Q_{B1}$ and $Q_{B2}$ are each degenerated using a degeneration impedance.

10. A transconductor circuit as in claim 5, where a value of the degeneration impedance of each of $Q_{B1}$ and $Q_{B2}$ is about twice the value of a degeneration impedance that would be used if only a single degenerated bias transistor $Q_B$ were used in place of $Q_{B1}$ and $Q_{B2}$.

11. A transconductor circuit as in claim 1, forming a part of a mixer of a cellular telephone.

12. A transconductor circuit as in claim 1, disposed in a radio frequency integrated circuit.

13. A transconductor circuit as in claim 1, disposed in a radio frequency integrated circuit of a direct conversion receiver of a cellular telephone.

14. A transconductor circuit as in claim 1, disposed in a radio frequency integrated circuit as part of a down-conversion mixer of a direct conversion receiver of a cellular telephone.

15. A method to substantially cancel second-order intermodulation distortion and enhance a second order intercept point in a transconductance circuit, comprising:
constructing the circuit to comprise a first input device $M_1$, a second input device $M_2$ and a bias setting device $M_B$ each having a control terminal coupled to a differential radio frequency input signal, where an output of $M_B$ is coupled to said control terminal of each of said $M_1$ and $M_2$; and
partitioning $M_B$ into two equal sized paralleled bias setting devices $M_{B1}$ and $M_{B2}$, where $M_{B1}$ and $M_{B2}$ are coupled to said control terminals of $M_1$ and $M_2$ for establishing a bias voltage at the control terminals of $M_1$ and $M_2$ and wherein said differential radio frequency input signal is coupled to a base of $M_{B1}$ and a base of MB2, respectively.

16. A method as in claim 15, further comprising coupling $M_1$, $M_2$ and $M_B$ to a supply voltage, and operating the circuit with said supply voltage of about one volt.

17. A method as in claim 15, where $M_1$, $M_2$, $M_{B1}$ and $M_{B2}$ are CMOS field effect transistors (FETS) and where said control terminal of each is a gate, where $M_1$ and $M_2$ are connected in a common source configuration, where a drain of $M_{B1}$ is coupled to said gate of $M_1$ through a first resistance and to said gate of $M_2$ through a second resistance, and where a drain of $M_{B2}$ is coupled to said gate of $M_1$ through said first resistance and to said gate of $M_2$ through said second resistance, where said drain of each of $M_{B1}$ and $M_{B2}$ is coupled to a source of bias current $I_B$, and where said gate of $M_{B1}$ and said gate of $M_{B2}$ are each capacitively coupled to said differential RF input signal.

18. A method as in claim 15, where $M_1$, $M_2$, $M_{B1}$ and $M_{B2}$ are bipolar transistors $Q_1$, $Q_2$, $Q_{B1}$ and $Q_{B2}$ and where said control terminal of each is a base, where $Q_1$ and $Q_2$ are connected in a common emitter configuration, where a collector of each of $Q_{B1}$ and $Q_{B2}$ is coupled to a source of bias current $I_B$ and to a base of a further bias transistor $Q_{Bb}$ having an emitter coupled to said base of Q1 through a first resistance and to said base of $Q_2$ through a second resistance, where said base of $Q_{B1}$ is coupled to said first resistance and to said base of $Q_1$, and where said base of $Q_{B2}$ is coupled to said second resistance and to said base of $Q_2$, and where said bases of $Q_1$, $Q_2$, $Q_{B1}$ and $Q_{B2}$ are each capacitively coupled to said differential RF input signal.

19. A method as in claim 18, further comprising coupling a collector of $Q_{Bb}$ to a supply voltage $V_{DD}$.

20. A method as in claim 18, where emitters of $Q_1$, $Q_2$, $Q_{B1}$ and $Q_{B2}$ are each degenerated using a degeneration impedance.

21. A method as in claim 20, where a value of the degeneration impedance of each of $Q_{B1}$ and $Q_{B2}$ is about twice the value of a degeneration impedance that would be used if only a single degenerated bias transistor $Q_B$ were used in place of $Q_{B1}$ and $Q_{B2}$.

22. A method as in claim 15, further comprising using said transconductance circuit as a part of a mixer of a cellular telephone.

23. A method as in claim 15, further comprising using said transconductance circuit as a part of a radio frequency integrated circuit.

24. A method as in claim 15, further comprising using said transconductance circuit as a part of a radio frequency integrated circuit of a direct conversion receiver of a cellular telephone.

25. A method as in claim 15, further comprising using said transconductance circuit as a part of a radio frequency integrated circuit as part of a down-conversion mixer of a direct conversion receiver of a cellular telephone.

26. A method as in claim 1, where said supply voltage $V_{DD}$ has a value of about one volt.

27. A method as in claim 19, where said supply voltage $V_{DD}$ has a value of about 1.2 volts.

28. A mobile radio frequency communications unit comprising at least one radio frequency integrated circuit that contains at least one transconductance circuit that comprises a first input device $M_1$, a second input device $M_2$ and a bias setting device $M_B$ each having a control terminal coupled to a differential input radio frequency signal, where an output of $M_B$ is coupled to said control terminal of each of said $M_1$ and $M_2$, where $M_B$ is fabricated as two substantially equal sized paralleled bias setting devices $M_{B1}$ and $M_{B2}$, where $M_{B1}$ and $M_{B2}$ are coupled to said control terminals of $M_1$ and $M_2$ for establishing a bias voltage at the control terminals of $M_1$ and $M_2$ and operate so as to substantially cancel second-order intermodulation distortion and enhance a second order intercept point of said transconductance circuit, and wherein said at least differential radio frequency signal is coupled to a base of MB1 and a base of MB2, respectively.

29. A mobile radio frequency communications unit as in claim 28, where $M_1$, $M_2$, $M_{B1}$ and $M_{B2}$ are each one of a MOS device or a bipolar device.

30. A mobile radio frequency communications unit as in claim 28, where $M_1$, $M_2$, $M_{B1}$ and $M_{B2}$ are each degenerated.

31. A mobile radio frequency communications unit as in claim 28, where a value of a degeneration impedance of each of $M_{B1}$ and $M_{B2}$ is about twice the value of a degeneration impedance that would be used if only the single degenerated bias device $M_B$ were used in place of $M_{B1}$ and $M_{B2}$.

32. A mobile radio frequency communications unit as in claim 28, where said differential input radio frequency signal is comprised of $v_{RF+}$ and $v_{RF-}$, and where said control terminal of each of $M_1$ and $M_{B1}$ is capacitively coupled to $v_{RF+}$, and where said control terminal of each of $M_2$ and $M_{B2}$ is capacitively coupled to $v_{RF-}$.

33. A mobile radio frequency communications unit as in claim 28, where at least said transconductance circuit operates with a supply voltage $V_{DD}$ that has a value of about 1.2 volts or less.

* * * * *